United States Patent
Hirabayashi et al.

[11] Patent Number: 6,099,706
[45] Date of Patent: Aug. 8, 2000

[54] MAGNETIC FILM FORMING APPARATUS WHICH APPLIES A PARALLEL MAGNETIC FIELD ACROSS A SUBSTRATE

[75] Inventors: Fumihito Hirabayashi, Yamanashi; Satoshi Umehara; Kazuo Sekine, both of Hitachi, all of Japan

[73] Assignee: Hitachi, Ltd., Tokyo, Japan

[21] Appl. No.: 09/210,979

[22] Filed: Dec. 15, 1998

[30] Foreign Application Priority Data

Dec. 16, 1997 [JP] Japan .................................... 9-346665

[51] Int. Cl.⁷ ............................. C23C 14/34; C23C 16/00
[52] U.S. Cl. ............................... 204/298.16; 204/298.15; 118/728
[58] Field of Search ...................... 204/298.16, 298.15, 204/192.12, 192.2, 298.19; 118/723 E, 715, 728

[56] References Cited

U.S. PATENT DOCUMENTS

| | | | |
|---|---|---|---|
| 4,525,262 | 6/1985 | Class et al. | 204/192.12 |
| 4,581,118 | 4/1986 | Class et al. | 204/192.12 |
| 4,853,102 | 8/1989 | Tateishi et al. | 204/298.16 |
| 4,865,709 | 9/1989 | Nakagawa et al. | 204/192.2 |
| 5,045,166 | 9/1991 | Bobbio | 204/298.16 |
| 5,512,156 | 4/1996 | Yamanishi et al. | 204/298.16 |
| 5,589,039 | 12/1996 | Hsu | 204/192.2 |
| 5,630,916 | 5/1997 | Gerrish et al. | 204/298.16 |
| 5,804,041 | 9/1998 | Hurwitt | 204/298.16 |
| 5,858,180 | 1/1999 | Hsu | 204/298.16 |

FOREIGN PATENT DOCUMENTS 9-71862 3/1997 Japan .
9-228041 9/1997 Japan .

*Primary Examiner*—Nam Nguyen
*Assistant Examiner*—Gregg Cantelmo
*Attorney, Agent, or Firm*—Beall Law Offices

[57] ABSTRACT

A magnetic film forming apparatus includes a film forming source to emit film-forming particles, a substrate holder for holding a substrate on which a magnetic film is formed with the film-forming particles, and a magnetic field generating circuit for applying the magnetic field to the substrate. The magnetic field generating circuit includes two pairs of magnets. Each pair of magnets is composed of two bar-shaped magnets combined in a line apart from each other by a gap of distance d. The pair of magnets have respective pairs of magnetic poles, with the direction of each pair of the magnetic poles being perpendicular to the longitudinal direction of the pair of magnets and having the same orientation. The two pairs of magnets are arranged apart from each other by the distance L in the horizontal x-y plane, substantially symmetrically to the vertical central y-axis of the substrate. This way, the magnetic film forming apparatus can be decreased in size and uniform parallelism of the magnetic field can be applied to the substrate.

11 Claims, 3 Drawing Sheets

MAGNETIC FILM FORMING APPARATUS WHICH APPLIES A PARALLEL MAGNETIC FIELD ACROSS A SUBSTRATE

BACKGROUND OF THE INVENTION

The present invention relates to a magnetic film forming apparatus, and in particular to a magnetic film forming apparatus capable of generating a uniform magnetic field to form a magnetic film with an excellent magnetic characteristic.

As a method of forming a magnetic film in which the magnetic moment is arranged in one direction, an in-magnetic-field sputtering-method is known according this method, a magnetic film is formed while orienting the magnetization direction of film forming particles by applying a magnetic field to the film forming particles in one direction.

In a conventional magnetic film forming apparatus for forming a magnetic film by using the in-magnetic-field sputtering method disclosed, for example, in Japanese Patent Application Laid-Open Hei-7 254603 and Japanese Patent Application Laid-Open Hei-8 30780. A substrate on which a magnetic film is formed is placed opposite to a target in a sputtering chamber. The substrate is held by a substrate holder, and further kept in parallel to the target at a predetermined distance by internal fittings. Moreover, two permanent magnets are provided on the substrate holder. In the upper part of the sputtering chamber, a guide bar of a heater is attached to the sputtering chamber via an o-ring. In the aperture part in the lower portion of the sputtering chamber, a target electrode is fixed to the sputtering chamber via an insulation member, and the target is attached to the target electrode. Also, an earth shield is provided around and apart from the target with a constant gap distance.

The magnetic film forming apparatus generates plasma by applying voltage to the target from an RF (radio wave) power source via the target electrode, and ions in the generated plasma make sputtering-particles emit from the target. The sputtering-particles emit from the target arrive at the surface of the substrate, and form a magnetic film on the surface. Since the magnetic field near around the substrate is applied by the permanent magnets provided on the substrate holder, the magnetization direction of the sputtering-particles in the formed magnetic film is oriented in the same direction.

In the space near the substrate in this magnetic film forming apparatus, two bar-shaped permanent magnets are arranged at the both sides of the substrate in parallel to the substrate. Moreover, the substrate is fixed in the center of the space between the two permanent magnets, and an orientation flat is provided on the substrate so it will not rotate.

However, in the above-mentioned composition of this conventional magnetic film forming apparatus, in both the top portions of the substrate in the longitudinal direction, the generated magnetic field is not straight between the two permanent magnets, but instead expands somewhat toward the outside of the substrate. Therefore, to decrease the expansion of the magnetic field, a pair of auxiliary magnets are provided opposite to each other at places between pairs of end portions of the two permanent magnets arranged in parallel. Otherwise two auxiliary magnets are attached to the two ends of the respective permanent magnet. Thus, in a comparatively wide region between the two permanent magnets, a magnetic field perpendicular to those magnets can be realized.

Such a composition or arrangement of the main permanent magnets and the auxiliary magnets is complicated, and has been difficult to optimize. Furthermore, to reduce the variance in the distribution of etching which is performed on the surface of the substrate in advance and in the property of a formed magnetic film, it is desirable to set a large distance L between the two permanent magnets, which in turn requires a larger length for the two magnets. Moreover, the optimal arrangement for the magnets of given sizes is uniquely determined. Accordingly, if the distance L between the two permanent magnets is changed to meet a requirement to change the strength or the distribution of the magnetic field, it becomes difficult to obtain the optimal arrangement of the magnets again by adjusting the positions of the auxiliary magnets.

SUMMARY OF THE INVENTION

The present invention has been achieved in consideration of the above described problems, and is aimed firstly at providing a magnetic film forming apparatus of a simple and small-sized composition, capable of applying a magnetic field of uniform distribution to the surface of a substrate, and secondly at providing a magnetic film forming apparatus capable of adjusting the strength or the distribution of the magnetic field applied to the substrate by changing the arrangement of the magnets while maintaining the uniform magnetic field distribution.

The above-mentioned objects are attained by means having the following features.

The fundamental feature of the present invention is a magnetic film forming apparatus including a film-forming source to emit film-forming particles, a substrate holder for holding a substrate on which a magnetic film is formed with the film-forming particles, and a magnetic field generating means for applying the magnetic field to the substrate; wherein the magnetic field generating means has a composition such that the ratio of an area of the substrate to an area in a horizontal x-y plane parallel to the surface of the substrate including the substrate inside the magnetic field generating means, is larger than about 0.14, and the skew angle of the magnetic field applied to the substrate is kept at less than 0.6 deg. by suppressing the vertical expansion of the magnetic field at places near both vertical peaks of the substrate.

Another feature of the present invention is that, in the above magnetic film forming apparatus of the fundamental feature, the magnetic field generating means comprises two pairs of magnets, each pair of magnets being composed of two bar-shaped magnets combined in a line apart from each other by a gap of distance d, the pair of magnets having respective pairs of magnetic poles, with the direction of each pair of magnetic poles being perpendicular to the longitudinal direction of the pair of magnets and having the same orientation, and the two pairs of magnets being arranged apart from each other by the distance L in the horizontal x-y plane, almost symmetrically to the vertical central y-axis of the substrate.

Still another feature of the present invention is that, in the above magnetic film forming apparatus, the pairs of magnets are all permanent magnets having almost the same shape.

An additional feature of the present invention is that, in the above magnetic film forming apparatus, a pair of auxiliary magnets are arranged in the horizontal x-y plane between the two pairs of magnets, almost symmetrically to the central x-axis of the substrate.

A further feature of the present invention is that, in the above magnetic film forming apparatus, a pair of auxiliary magnets are attached to the respective end portions of each pair of magnets.

Yet another feature of the present invention is that, in the above magnetic film forming apparatus, the magnets are optimally arranged based on a three-dimensional magnetic field distribution calculated in advance.

One more feature of the present invention is that, in the above magnetic film forming apparatus, the optimal value of the gap of distance d is given by a function of the distance L between the pairs of magnets in optimizing the arrangement of the magnets.

Still another feature of the present invention is that, in the above magnetic film forming apparatus, the two pairs of magnets and each magnet of the pairs of magnets are attached so that the distance L between the pairs of magnets is variable, each magnet is rotatable, and the magnetic field applied to the substrate is adjusted to achieve a required magnetic field by changing the distance L and the rotational angle of each magnet.

Still another feature of the present invention is that, in the above magnetic film forming apparatus, a magnetic field monitoring means for detecting the magnetic field applied to the substrate is provided in the sputtering chamber, and the arrangement of the magnets is optimally adjusted based on the detection results of the magnetic field monitoring means.

Yet another feature of the present invention is that, in the above magnetic film forming apparatus of the fundamental feature, the magnetic field generating means comprises two solenoids with the same winding direction, the solenoids being arranged so that their axes are connected in one line in the parallel x-direction of the substrate placed between the two solenoids in a horizontal x-y plane including the central axes of the solenoids, and the two solenoid further being arranged almost symmetrically to the vertical central y-axis of the substrate, wherein current flows unidirectionally through the solenoids.

An additional feature of the present invention is that, in the above magnetic film forming apparatus, the size of the solenoids and their arrangement are optimized based on a three-dimensional magnetic field distribution calculated in advance and applied to the substrate.

Still another feature of the present invention is that, in the above magnetic film forming apparatus, a magnetic field monitoring means for detecting the magnetic field applied to the substrate is provided in the sputtering chamber, and the current flow in the solenoids is adjusted based on the detection results of the magnetic field monitoring means so that the magnetic field applied to the substrate matches a required magnetic field.

DETAILED DESCRIPTION OF THE EMBODIMENTS

Hereafter, details of embodiments will be explained with reference to the drawings.

Figure 2:
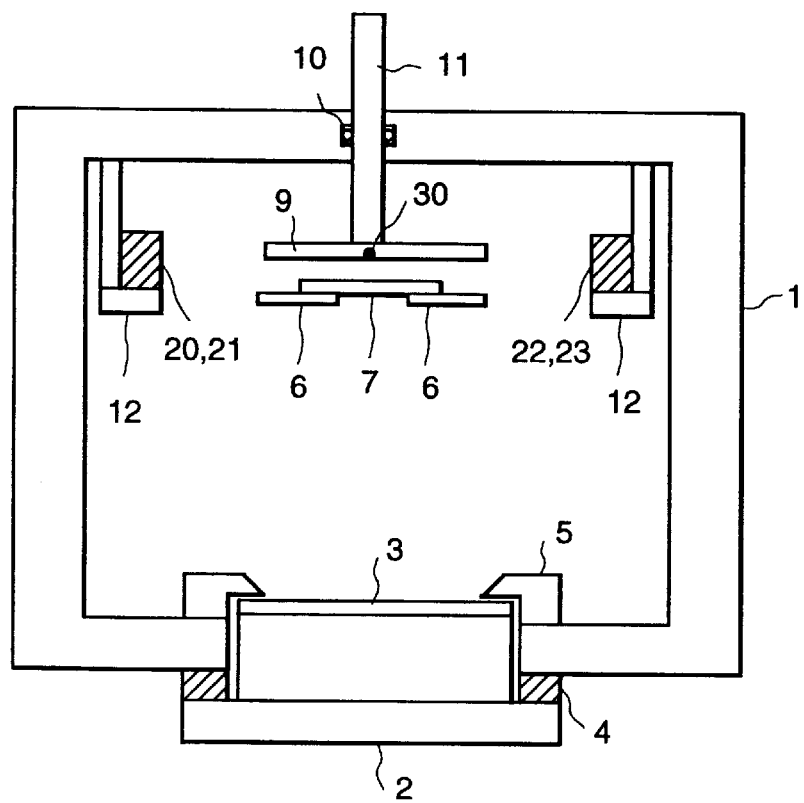
FIG. 2 is a vertical cross section of a magnetic film forming apparatus of an embodiment according to the present invention.

FIG. 2 is a vertical cross section of a magnetic film forming apparatus of an embodiment according to the present invention.

In this figure, numeral 12 indicates a magnet attachment plate to which the later-discussed magnets are attached, and numerals 20, 21, 22, and 23 indicate the magnets. Here, the composition of the magnetic film forming apparatus shown in FIG. 2 is different from that of the above-mentioned conventional magnetic film forming apparatus only in that the four permanent magnets 20–23 are attached to the magnet attachment plate and the new arrangement of the magnets is established. Here, numerals 6, 9, 10, and 11 indicate a heater, an o-ring, and an guide bar of the heater, respectively. Moreover, a magnetic monitoring element 30 to detect the magnetic field applied to the substrate 7 is provided in the vicinity of the substrate 7 as needed.

Figure 1:
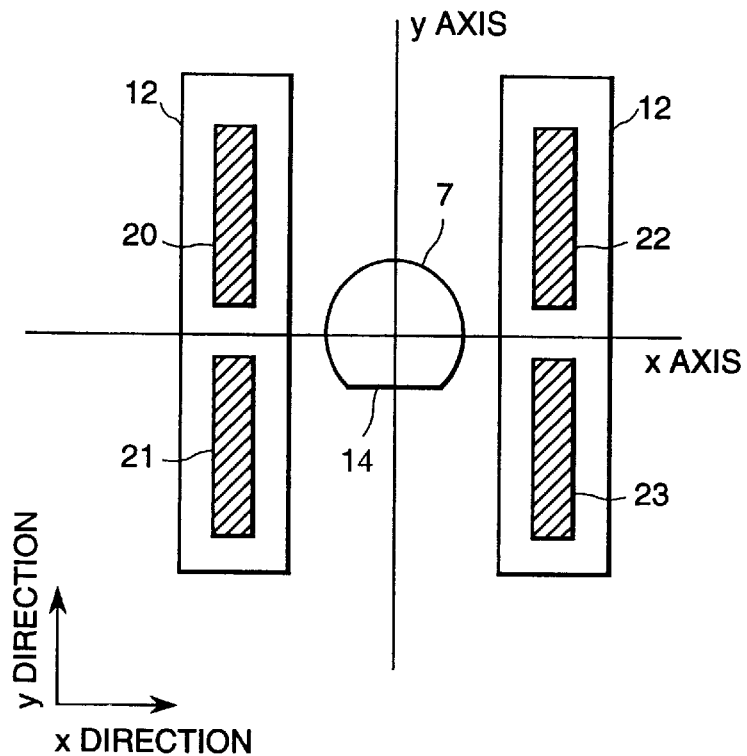
FIG. 1 shows an example of the arrangement of magnets attached to a magnet attachment plate and a substrate.

FIG. 1 shows an example of the arrangement of the four bar-shaped magnets 20–23 attached to a magnet attachment plate 12 and a substrate 7.

As shown in FIG. 1, an N-pole magnetic field generating means is composed of a pair of magnets 20 and 21 whose N-pole is directed to the substrate 7, and an S-pole magnetic field generating means is further composed of a pair of other magnets 22 and 23 whose S-pole is directed to the substrate 7. The substrate 7 is placed almost at the central position between the N-pole and S-pole magnetic field generation means in the horizontal plane including the N-pole and S-pole magnetic field generation means. Moreover, an orientation flat part 14 is formed in the substrate in such a way as to not rotate.

Furthermore, the magnetic field distribution applied to the substrate 7 is explained below with reference to FIG. 1.

Generally, reading a bar-shaped permanent magnet whose longitudinal direction is perpendicular to its magnetized direction (the direction of the poles), the surface magnetic flux is strongest in the vicinity of its central position, and the magnetic flux is radiated from or centered on the central position. Therefore, if the four magnets 20–23 are arranged as shown in FIG. 1, the magnetic flux is radiated from or centered on the central position of each magnet. Accordingly, the respective vertical components (y-direction component) of the magnetic flux generated by the pair of magnets 20 and 21 (22 and 23) cancel each other out, and the magnetic field generated by the N-pole and S-pole magnetic field generation means is uniformly parallel to the x-direction. Thus, by using this arrangement of the four magnets, a magnetic field uniformly parallel to the x-direction can be applied to all places on the surface of the substrate 7 by the four magnets 20–23.

Furthermore, the film-forming operations of the magnetic film forming apparatus of this embodiment are explained below with reference to FIG. 1 and FIG. 2.

Firstly, the magnets 20–23 and the substrate 7 are arranged and attached to the magnet attachment plate 12 and the substrate holder 6, respectively. Next, voltage is applied to the target 3 with the RF power source, and plasma is generated. Consequently, sputtering-particles are emitted from the target 3. The emitted sputtering-particles reach the surface of the substrate 7, and form a magnetic film on the substrate. Since the magnetic field uniformly parallel to the x-direction is applied to the whole area near the substrate 7 by the magnets 20–23 attached to the magnet attachment plate 12 as mentioned above, the sputtering-particles are magnetized in the same direction. Thus, a magnetic film with the unidirectional magnetization is formed.

Next, the method of arranging the magnets in the magnetic film forming apparatus of this embodiment so that the magnetic field applied to the substrate 7 is uniformly focused in one direction parallel to the x-direction, is discussed with reference to FIG. 3 and FIG. 4.

Figure 3:
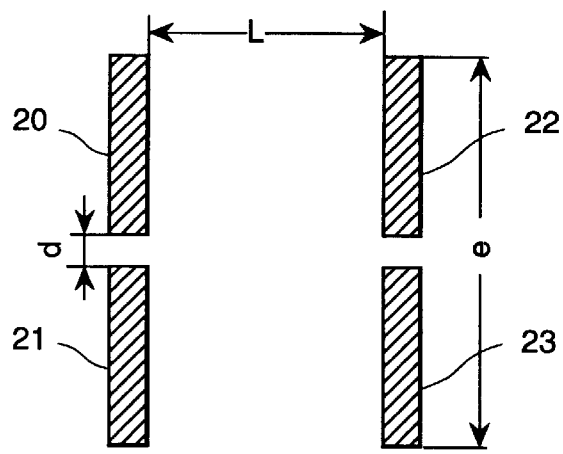
FIG. 3 is a diagram for depicting main parameters determining the magnetic field distribution in the arrangement shown in FIG. 1.

In FIG. 3, symbols d, L, and indicate the gap distance between the two magnets in each pair of magnets 20 and 21 (22 and 23 ): that is, the N-pole magnetic field generating means (20 and 21) and the S-pole magnetic field generating means(22 and 23), and the longitudinal length of these magnetic field generating means.

Figure 4:
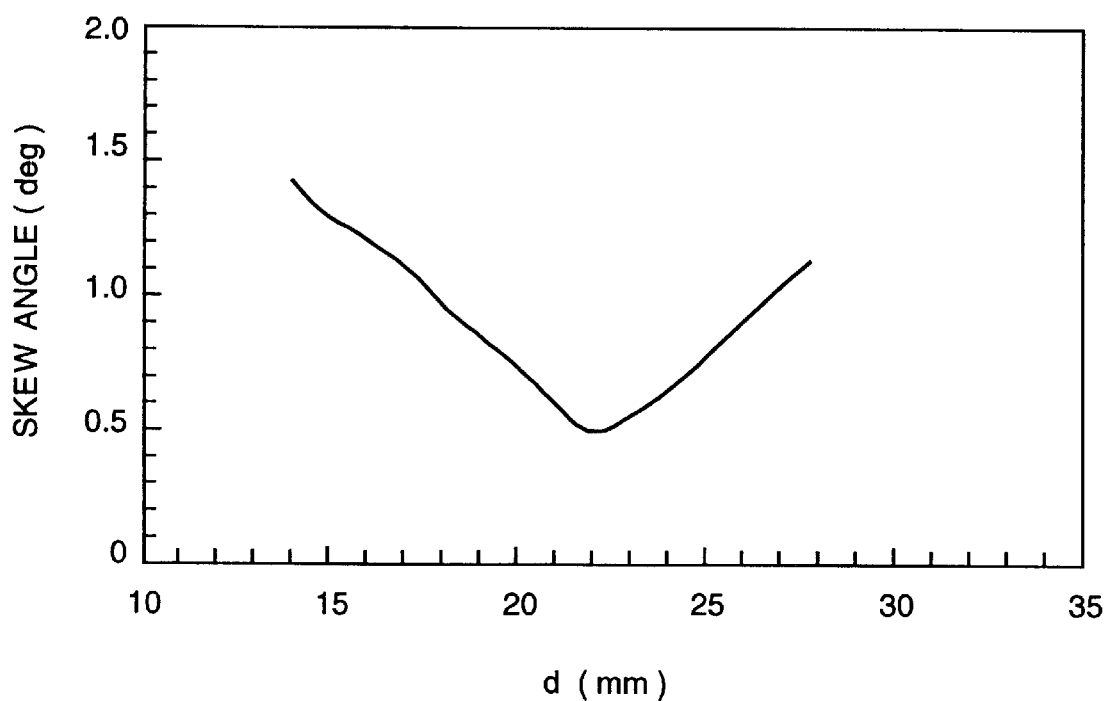
FIG. 4 shows the relationship between the skew angle and the gap distance in each pair of magnets of a magnetic field generating means in the magnetic film forming apparatus of this embodiment.

FIG. 4 shows the relationship between the skew angle and the gap of distance d in each pair of magnets of a given sizes in the magnetic film forming apparatus. The skew angle is defined as the maximum angle difference among the angle differences in the horizontal direction between the magnetic field angle and the required magnetic field direction at every positions in the substrate 7 with respect to one set value of d.

The strength and direction of the magnetic field (magnetic field distribution) applied to the substrate 7 is determined by the proper surface magnetic flux of each magnet and the relative positional relationships among the magnets 20–23. In this embodiment, the arrangement of the magnets 20–23 to obtain the magnetic field uniformly focused in one direction is determined as follows.

To begin with, the distance L between the two pairs of magnets and the total length e of the two pairs are set. Next, parameter survey calculations of the magnetic field distribution are performed by using a three-dimensional magnetic field analysis program and varying the parameter d. In the parameter survey calculation, the size and remanence of each magnet and the arrangement of the magnets 20–23 are input to the three-dimensional magnetic field analysis program.

From the example shown in FIG. 4, which is the result of a parameter survey, it is seen that the skew angle becomes smallest at a value of the gap of distance d. Therefore, it is possible to apply the optimal magnetic field to the substrate by optimizing the gap of distance d. Thus, in accordance with the above processing, it is possible to determine the size of each magnet and the arrangement of the magnets by which the uniformly parallel magnet field can be applied to the substrate 7.

Furthermore, in this embodiment, since the optimal arrangement of the magnets depends on only the distance L between the pairs of magnets and the gap of distance d, the optimization of the magnet arrangement becomes comparatively easy. Also, since a pair of magnets is used as a magnetic field generation means for each pole it is not necessary to use a large magnet for each magnet of the pairs.

In the following, the other embodiments according to the present invention will be explained with reference to FIGS. 5, 6, and 7.

Figure 5:
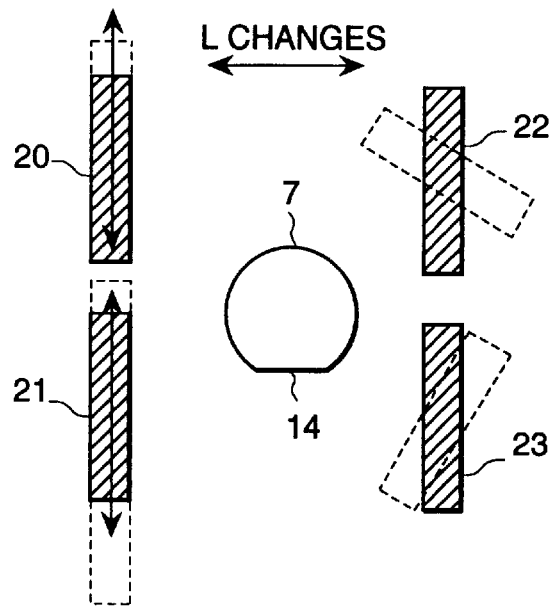
FIG. 5 shows the arrangement of magnets attached to a magnet attachment plate and a substrate in the magnetic film forming apparatus of another embodiment according to the present invention.

FIG. 5 shows the arrangement of magnets attached to the magnet attachment plate 12 and the substrate 7 in the magnetic film forming apparatus of another embodiment in which the positions of the magnets 20–23 and the rotational angle of each magnet are variable. In this embodiment, while the uniform parallelism of the magnetic field is kept, the strength of the magnetic field applied to the substrate 7 can be adjusted by changing the gap of distance d between the two magnets of each pair and the distance L between the two pairs. Furthermore, by the above adjustment, the distortion in the uniformly parallel magnetic field which is caused by the variance of the surface magnetic flux density in the four magnets can be also corrected.

Thus, according to this embodiment, even if the distance L between the two pairs of magnets is varied, the strength of the magnetic field applied to the substrate 7 can be changed without losing the uniform parallelism of the magnetic field. The above adjustment is carried out based on the result of the pre-calculated magnetic field distribution or on the results of measurements performed by the magnetic field monitoring element 30.

Figure 6:
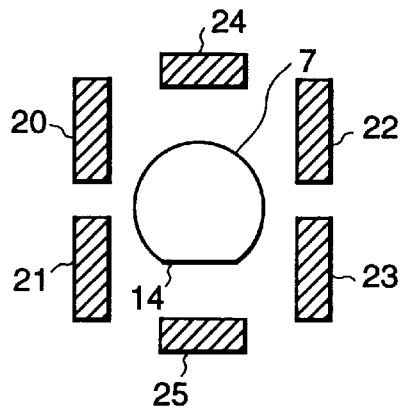
FIG. 6 shows the arrangement of magnets attached to a magnet attachment plate and a substrate in the magnetic film forming apparatus of still another embodiment according to the present invention.

FIG. 6 shows the arrangement of magnets attached to the magnet attachment plate 12 and the substrate 7 in the magnetic film forming apparatus of still another embodiment in which a pair of auxiliary magnets 24 and 25 are placed between the two pairs of magnets in the horizontal x-y plane symmetrically to the central x-axis of the substrate 7. In this embodiment, since the expansion in the vertical y-direction, of the magnetic field at places near both vertical tops of the substrate 7 can be more suppressed than in the embodiment shown in FIG. 1, it is possible to realize the more excellently uniform parallelism of the magnetic field applied to the substrate 7.

Figure 7:
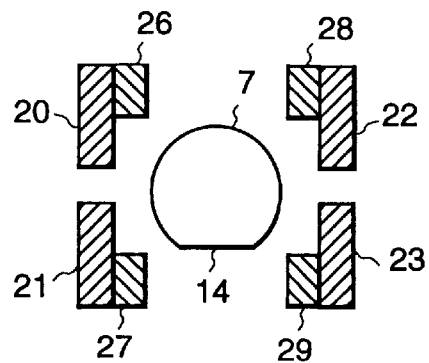
FIG. 7 shows the arrangement of magnets attached to a magnet attachment plate and a substrate in the magnetic film forming apparatus of yet another embodiment according to the present invention.

Also, FIG. 7 shows the arrangement of magnets attached to the magnet attachment plate 12 and the substrate 7 in the magnetic film forming apparatus of still another embodiment in which each of a pair of auxiliary magnets 26 and 27 (28 and 29) is attached to each magnet of each pair 20 and 21 (22 and 23) on the inside surface of the end portion at the side opposite to the gap, which is directed to the substrate 7. In this embodiment also, since the vertical expansion of the magnetic field at places near both vertical peaks of the substrate 7 can be suppressed more, it is possible to realize a more perfectly uniform parallelism in the magnetic field applied to the substrate 7 than that in the embodiment shown in FIG. 1.

In the above embodiments, although magnets are used for the magnet field generation means, the excellently uniform parallelism of the magnetic field applied to the substrate 7 can also be realized by using solenoids.

Furthermore, it has been confirmed by the inventors that the ratio of an area of the substrate 7 to an area in a horizontal x-y plane parallel to the surface of said substrate including the substrate inside said magnetic field generating means is larger than about 0.14, and the skew angle of the magnetic field applied to said substrate is kept at less than 0.6 deg. by the above embodiments.

As explained above, in accordance with the present invention, since the uniformly parallel magnetic field can be applied to the whole of a substrate without increasing the size of the magnets even if the distance between the pairs of magnets is increased to correspond to a larger substrate, it is possible to obtain a magnetic film with a more outstanding magnetic characteristics than that formed by a conventional magnetic film forming apparatus. Furthermore, since it is possible to adjust the strength of the magnetic field applied to the substrate without losing the uniform parallelism of the magnetic field, by composing the magnet field generating system so that the positions of the magnets and the rotational angle of each magnet are adjustable, or by providing a pair of auxiliary magnets between the two pairs of magnets, the desired distribution of the magnetic field applied to the substrate can be realized.

What is claimed is:

1. A magnetic film forming apparatus including a film forming source to emit film-forming particles, a substrate holder for holding a substrate on which a magnetic film is formed with said film-forming particles, and a magnetic field generating means for applying a magnetic field to said substrate; wherein said magnetic field generating means has a composition such that a ratio of an area of said substrate to an area surrounded said magnetic field generating means in a horizontal x-y plane parallel to a surface of said substrate is larger than about 0.14, and a skew angle of said magnetic field applied to said substrate is kept at less than 0.6 deg., by suppressing a vertical expansion of said magnetic field at places near both vertical peaks of said substrate; wherein said magnetic field generating means comprises two pairs of magnets, each pair of said magnets being composed of two bar-shaped magnets combined in a line apart from each other with a gap of distance d, said pair of magnets having respective pairs of magnetic poles, the direction of each pair of said magnetic poles being perpendicular to a longitudinal direction of said pair of magnets and having the same direction, and said two pairs of said magnets being arranged apart from each other with a distance L in said horizontal x-y plane, and substantially symmetrically to a vertical central y-axis of said substrate.

2. magnetic field film forming apparatus according to claim 1, wherein said pairs of magnets are all permanent magnets having substantially the same shape.

3. A magnetic film forming apparatus according to claim 1, wherein a pair of auxiliary magnets are arranged in the horizontal x-y plane between said two pairs of magnets, and substantially symmetrically to a central x-axis of said substrate.

4. A magnetic film forming apparatus according to claim 1, wherein a pair of auxiliary magnets are attached to respective end portions of each pair of magnets.

5. A magnetic film forming apparatus according to claim 1, wherein said magnets are optimally arranged based on a pre-calculated three-dimensional magnetic field distribution.

6. A magnetic film forming apparatus according to claim 5, wherein an optimal value of said gap of distance d is given by a function of the distance L between said pairs of magnets in optimizing the arrangement of said magnets.

7. A magnetic film forming apparatus according to claim 1, wherein said two pairs of magnets and each magnet of said pairs of magnets are attached so that the distance L between said two pairs of magnets is variable, each magnet is rotatable, and the magnetic field applied to said substrate is adjusted to achieve a required magnetic field by changing the distance L and a rotational angle of each magnet.

8. A magnetic film forming apparatus according to claim 7, wherein a magnetic field monitoring means for detecting said magnetic field applied to said substrate is provided in a sputtering chamber, and the arrangement of said magnets is optimally adjusted based on detection results of said magnetic field monitoring means.

9. A magnetic film forming apparatus according to claim 1, wherein said magnetic field generating means comprises two solenoids with the same winding direction, with said two solenoids being arranged so that the axes of the two solenoids are connected in one line in a parallel x-direction of the substrate placed between said two solenoids in a horizontal x-y plane including central axes of said solenoids, and said two solenoids being further arranged substantially symmetrically to a vertical central y-axis of said substrate, wherein current flows unidirectionally in said two solenoids.

10. A magnetic film forming apparatus according to claim 9, wherein the size of said solenoids and their arrangement are optimized based on a pre-calculated three-dimensional magnetic field distribution applied to said substrate.

11. A magnetic film forming apparatus according to claim 9, wherein a magnetic field monitoring means for detecting said magnetic field applied to said substrate is provided in a sputtering chamber, and the current flow in said solenoids is adjusted based on detection results of said magnetic field monitoring means so that said magnetic field applied to said substrate matches a required magnetic field.

* * * * *